United States Patent
Hwang et al.

(10) Patent No.: US 7,118,945 B2
(45) Date of Patent: Oct. 10, 2006

(54) METHOD OF FORMING INSULATING LAYER AND METHOD OF FABRICATING THIN FILM TRANSISTOR USING THE SAME

(75) Inventors: Eui Hoon Hwang, Kyonggi-do (KR); Chan Il Park, Cheollabuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 236 days.

(21) Appl. No.: 10/292,513

(22) Filed: Nov. 13, 2002

(65) Prior Publication Data

US 2003/0124863 A1 Jul. 3, 2003

(30) Foreign Application Priority Data

Dec. 28, 2001 (KR) .......................... P2001-0087130

(51) Int. Cl.
*H01L 21/84* (2006.01)
*H01L 21/00* (2006.01)

(52) U.S. Cl. ...................... 438/150; 438/151; 438/152; 438/153; 438/164

(58) Field of Classification Search ................ 438/164, 438/150–155; 257/33, 312, 347
See application file for complete search history.

(56) References Cited

U.S. PATENT DOCUMENTS

| 5,759,746 | A  | * | 6/1998  | Azuma et al. .............. 430/313 |
| 6,072,193 | A  | * | 6/2000  | Ohnuma et al. .............. 257/57 |
| 6,420,758 | B1 | * | 7/2002  | Nakajima ................... 257/350 |
| 6,472,684 | B1 | * | 10/2002 | Yamazaki et al. ............ 257/72 |
| 6,583,471 | B1 | * | 6/2003  | Yamazaki et al. .......... 257/350 |
| 6,770,515 | B1 | * | 8/2004  | Makita et al. ............. 438/149 |
| 2002/0074548 | A1 | * | 6/2002 | Lee et al. .................... 257/59 |

FOREIGN PATENT DOCUMENTS

| JP | 7-130731 | 5/1995 |
| JP | 10-173052 | 6/1998 |
| KR | 2000-3505 | 1/2000 |

* cited by examiner

*Primary Examiner*—Duy-Vu N Deo
(74) *Attorney, Agent, or Firm*—McKenna Long & Aldridge LLP

(57) ABSTRACT

A method of forming an insulating layer including preparing a substrate and depositing an insulating layer on the substrate such that density of a top portion of the insulating layer is different from that of a bottom portion of the insulating layer.

21 Claims, 7 Drawing Sheets

Realted Art

Realted Art

Realted Art

METHOD OF FORMING INSULATING LAYER AND METHOD OF FABRICATING THIN FILM TRANSISTOR USING THE SAME

This application claims the benefit of the Korean Application No. P2001-87130 filed on Dec. 28, 2001, which is hereby incorporated by reference.

BACKGROUND OF THE INVENTION

1. Field of the Invention

The present invention relates to a liquid crystal display device, and more particularly, to a method of forming an insulating layer to control the step profile of a hole therethrough and a method of fabricating a thin film transistor using the same.

2. Discussion of the Related Art

As an information society develops, so increases the demand for information displays. Recently, many efforts have been made to research and develop various flat display panels, such as a liquid crystal display (LCD), a plasma display panel (PDP), a electroluminescent display (ELD), a vacuum fluorescent display (VFD), and the like. Due to the characteristics or advantages of a high quality color image, low weight, compact size, and low power consumption, an LCD is typically used instead of a cathode ray tube (CRT) for an image display of a moving picture. For example, an LCD can be utilized in devices that receive video or broadcast signals, such as televisions, computer monitors, and the like. An LCD can have high resolution, high brightness, a wide screen, as well as the characteristics of low weight, compactness, and low power consumption so as to be a general purpose display.

Such a general purpose LCD device includes a liquid crystal panel displaying an image and a driving unit for applying a driving signal to the liquid crystal panel. First and second glass substrates are bonded to each other so as to leave a predetermined space therebetween and a liquid crystal layer is injected between the first and second glass substrates to form the liquid crystal panel. Formed on the first glass substrate or TFT array substrate are a plurality of gate lines arranged in one direction to leave a predetermined interval between each other. A plurality of data lines are arranged on the first glass substrate in a direction vertical to the gate lines to leave a predetermined interval between each other. A plurality of pixel electrodes formed like a matrix are positioned in pixel areas defined between the gate and data lines, respectively. A plurality of thin film transistors switched by signals from the gate lines to transfer signals of the data lines to the pixel electrodes are also positioned respectively in the pixels areas. Formed on the second glass substrate or color filter substrate are a black matrix layer for preventing light leakage from areas other than the pixel areas, an R/G/B color filter layer for realizing colors, and a common electrode for realizing an image together with the pixel electrodes. In the case of a horizontal electric field type liquid crystal display device, the common electrode is formed on the first glass substrate.

The above-constituted first and second substrates are separated from each other by spacers, and bonded to each other through a sealant. Liquid crystal is then injected between the first and second substrates. The thin film transistor of the liquid crystal display device is mainly used as a switching device. A semiconductor layer of the thin film transistor is formed of amorphous silicon, which enables the fabrication of small-scaled TFT-LCD. However, amorphous silicon has a low mobility, which adversely affects the operation of a wide-screen TFT-LCD. Therefore, many efforts have been made to research and develop a polysilicon thin film transistor (TFT) using a polysilicon layer having an excellent mobility as a semiconductor layer. Such a polysilicon TFT facilitates both the fabrication and operation of a wide-screen TFT-LCD, and enables the integration of a driving integrated circuit (IC) on a TFT array substrate to provide for high integrity and reduced costs of manufacturing.

In general, a polysilicon layer can be formed by two methods. The first method is depositing polysilicon directly on a substrate. The second method is to deposit amorphous silicon on a substrate and then crystallize the deposited amorphous silicon into polysilicon.

A polysilicon TFT includes a gate electrode separated from an active layer by an insulating layer. Source/drain electrodes contact the active layer through the insulating layer, which separates the active layer from the gate electrode. The insulating layer is mainly formed of an inorganic insulating layer, such as silicon nitride ($SiN_x$) or silicon oxide ($SiO_x$). The inorganic insulating layer has excellent handling characteristics, a high insulation withstanding voltage and high metal adhesion.

A method of forming an insulating layer and a method of forming polysilicon TFT using the same insulating layer according to related art are explained in reference to FIGS. 1 and 2A–2F. A cross-sectional view for explaining a method of forming an insulating layer hole 9 in an insulating layer 6 according to related art is shown in FIG. 1. An insulating layer 6, as shown in FIG. 1, is deposited uniformly on a glass substrate 1 at 300~400° C. by plasma enhanced chemical vapor deposition (PECVD), low pressure chemical vapor deposition (LPCVD), or sputtering using silane ($SiH_4$) gas. The insulating layer 6 formed on the glass substrate 1 is an inorganic insulating layer, such as silicon nitride ($SiN_x$) or silicon oxide ($SiO_x$). Then, a photoresist 2 is coated on the insulating layer and patterned via exposure and development to form a photoresist hole 7 in the photoresist 2 for defining a hole in the insulating layer 6. A portion of the insulating layer 6 is removed selectively by a wet etch using the patterned photoresist 2 as a mask to form a insulating layer hole 9 in the insulating layer 6 and thus expose a portion of the glass substrate 1 commensurate with the photoresist hole 7 in the photoresist 2.

As shown in FIG. 1, when the insulating layer 6 is removed by wet etch, more of the upper portion of the insulating layer 6 is removed than a lower portion of the insulating layer 6 such that the insulating layer hole 9 has a poor step profile, which is much wider at the top of the contact hole than at the bottom of the insulating layer hole 9 and is not very sharp. The step profile, as shown in FIG. 1, is not very sharp since the side 9a of the insulating layer hole travels a distance L along the substrate 1 from the top edge of the insulating layer hole 9 to a bottom edge of the insulating layer hole 9 that is much greater than the thickness T of the insulating layer 6. A step profile of the insulating layer hole is sharper as L/T gets closer to 0. The poor step profile, as shown in FIG. 1, can occur because the wet etch is active for a longer period on the upper portion of the insulating layer since etching proceeds through the upper portion of the insulating layer to the lower portion of the insulating layer.

The same poor step profile, as shown in FIG. 1, can also be a result of or further exacerbated by an insulating layer 6 formed of $SiO_x$ having poor adhesion to the photoresist 2 such that the etchant penetrates between the insulating layer 6 and photoresist 2. Thus, the etch rate of the upper portion of the insulating layer 6, particularly at the upper edge of the insulating layer hole 9 will be accelerated because of the proximity of both a side surface and a top surface being etched. Hence, the step profile of the insulating layer hole 9 will have rounded top edges and/or long step profile, as shown in FIG. 1.

FIGS. 2A to 2F illustrate cross-sectional views of forming a polysilicon thin film transistor according to related art. The amorphous silicon (—Si) is deposited on an entire surface of a glass substrate 11 to form an amorphous silicon layer. Annealing is carried out using an excimer laser to crystallize the amorphous silicon layer into a polysilicon layer. The polysilicon layer is then patterned selectively to form an active layer 13, as shown in FIG. 2A. Subsequently, a first insulating layer 14 is formed on an entire surface including the active layer 13 by depositing an inorganic insulating layer such as silicon nitride ($SiN_x$) or silicon oxide ($SiO_x$) at 300~400° C. by PECVD, LPCVD, sputtering, or the like using silane ($SiH_4$) gas.

Referring to FIG. 2B, an electrically conductive material such as Al, Al alloy, or the like is deposited on an entire surface including the first insulating layer 14, and then patterned selectively by photolithography to form a gate electrode 15 on a predetermined portion over the active layer 13. Subsequently, n-type or p-type impurity ions are implanted in the active layer 13 using the gate electrode 15 as a mask. The impurity ions implanted in portions of the active layer 13 corresponding to both sides of the gate electrode 15 become source/drain regions 13a and 13c, and the remaining portion of the active layer 13 blocked by the gate electrode 15 to have no impurity ions implanted therein becomes a channel region 13b.

As shown in FIG. 2C, a second insulating layer 16 is formed by depositing an inorganic insulating layer such as silicon nitride, silicon oxide, or the like on an entire surface including the gate electrode 15. The second insulating layer 16 can be deposited by the same depositing method as for the first insulating layer 14. Then, a photoresist 12 is coated on an entire surface including the second insulating layer 16. Subsequently, the photoresist 12 is patterned by exposure and development to define a contact areas 17 with holes in the photoresist 12, as shown in FIG. 2D.

Referring to FIG. 2E, the second and first insulating layers 16 and 14 are selectively removed to form contact holes 19 that expose predetermined surfaces of the source/drain regions 13a and 13c, respectively, using the patterned photoresist 12 as a mask. In this instance, the etching process for forming the contact holes 19 is a process of removing a portion of the insulating layer 16, defined as a contact area 17 by the photoresist 12, using a chemical solution. An etching process using a chemical solution is called a wet etch as opposed to a process using plasma, which is called a dry etch. The wet etch is classified into a dipping and spraying. The dipping method is carried out in such a manner that a substrate is dipped into a solution bath filled with a chemical solution. The spray method is carried out in such a manner that a chemical solution is sprayed on a substrate.

Subsequently, a metal layer is deposited on a glass substrate 11 including the contact holes 19, regardless of which etching method is used. Photo and etching processes are then carried out to form source and drain electrodes 18a and 18c connected to the source and drain regions 13a and 13c, respectively. The source and drain electrodes 18a and 18c are isolated electrically from the gate electrode 15 by the second insulating layer 16. Thus, the polysilicon thin film transistor using polysilicon as a semiconductor layer in the related art is completed by the above-explained process, as shown in FIG. 2F.

A liquid crystal display device can include the polysilicon thin film transistor described above on the first substrate as the switching device of a pixel. As also described in the foregoing explanation, the first and second insulating layers 14 and 16 are selectively etched by wet etch. The wet etch is an isotropic etching process using a chemical solution so that equipment costs are reduced and the productivity is increased. However, the rectangular dimensions or step profile of an etched contact hole is degraded. For example, referring again to FIG. 2E, a chemical reaction occurs rapidly when the chemical solution flows in, whereby the second insulating layer 16 beneath the photoresist 12 is etched to a diameter significantly beyond the designed specification or contact area 17 defined by the photoresist while the first insulating layer 14 is under-etched. Hence, the rectangular dimensions or step profile of the contact hole through the first and second insulating layers are degraded.

Thus, a poor step profile or large diameters for each of the contact holes to a polysilicon thin film transistor increases the size of the TFT, as well as decreases the space for a pixel electrode. A decrease in the size of a pixel or increase in the size of a TFT reduces the resolution of the LCD panel. Therefore, it is important to increase the sharpness of a step profile for each of the contact holes to TFT.

In order to overcome the problem of contact holes with poor step profiles, dry etch using plasma has been introduced. The dry etch, which is anisotropic, has the advantage of step profile control and the disadvantage of etching the photoresist such that the pattern is affected. Another method include the steps of carrying out wet etch and then etching an under-etched portion with a dry etch to equalize the etch selectivity ratio between the first and second insulating layers. However, such a method needs an additional step, which increases process costs as well as requires two completely different types of processing equipment.

SUMMARY OF THE INVENTION

Accordingly, the present invention is directed to a method of forming an insulating layer and a method of fabricating a thin film transistor using the same that substantially obviates one or more of the problems due to limitations and disadvantages of the related art.

An object of the present invention is to provide a method of forming an insulating layer that facilitates control of a step profile for a hole to be formed in the insulating layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming an insulating layer according to the present invention includes the steps of preparing a substrate and depositing an insulating layer on the substrate such that density of a top portion of the insulating layer is different from that of a bottom portion of the insulating layer.

In another aspect of the present invention, a method of fabricating a thin film transistor includes the steps of forming an active layer on a substrate, forming a first insulating layer on the active layer, forming a gate electrode on the first insulating layer that is isolated from the active layer, forming source/drain regions by implanting ions in portions of the active layer at both sides of the gate electrode, respectively, forming a second insulating layer varying in density on the first insulating layer and the gate electrode, forming contact holes in the first and second insulating layers that expose the source/drain regions, respectively and forming source/drain electrodes connected to the source/drain regions through the contact holes, respectively.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
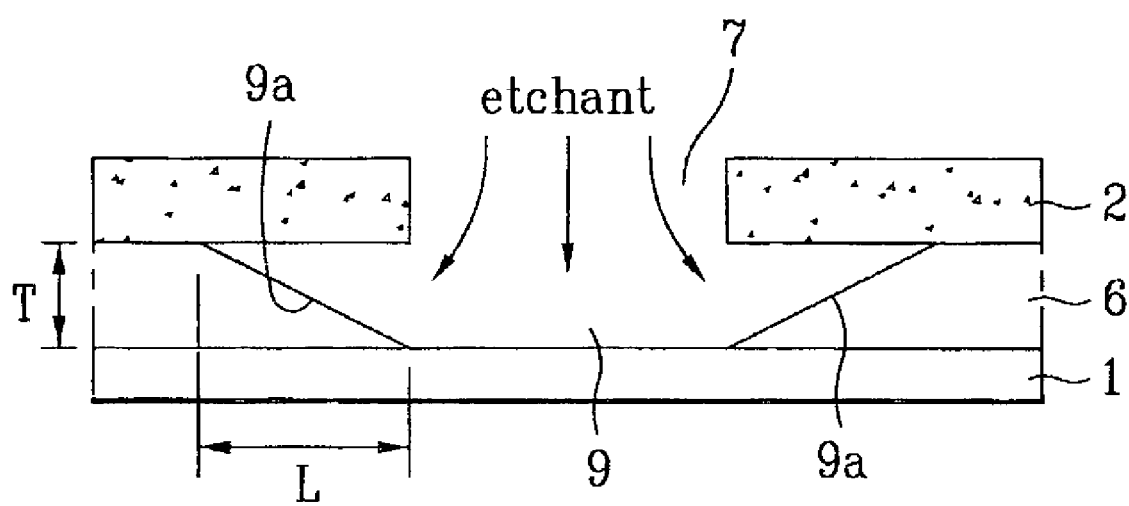
FIG. 1 illustrates a cross-sectional view for explaining a method of forming an insulating layer according to the related art.
Figure 2A:
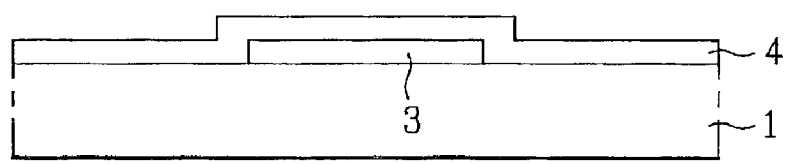
FIGS. 2A to 2F illustrate cross-sectional views depicting steps in forming a polysilicon thin film transistor according to the related art.
Figure 2B:
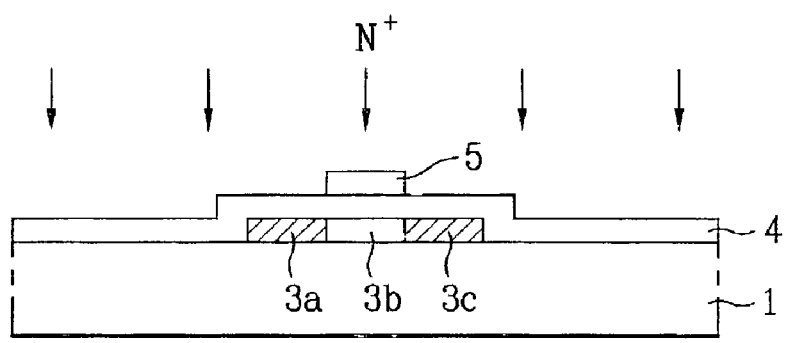
Figure 2C:
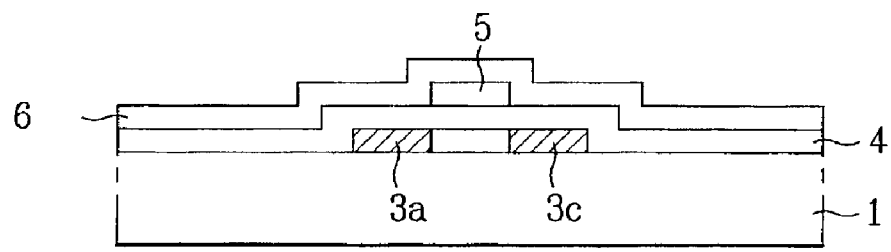
Figure 2D:
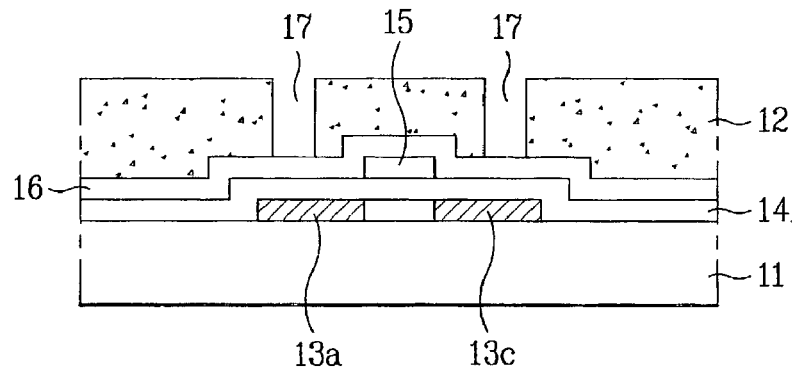
Figure 2E:
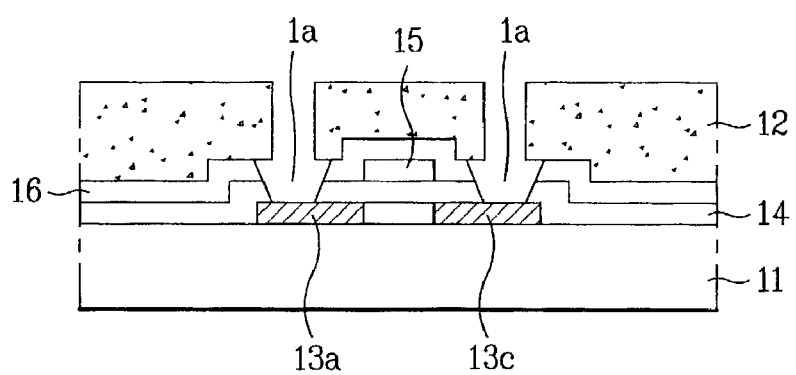
Figure 2F:
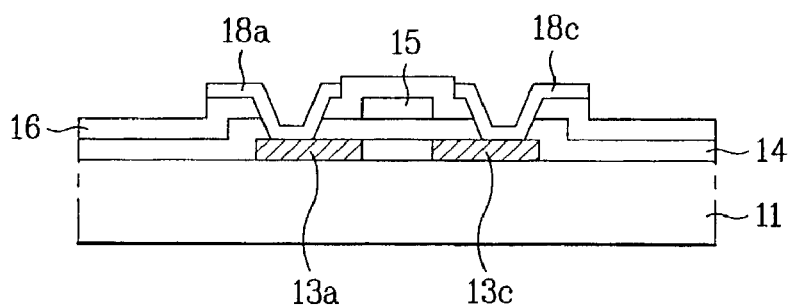
Figure 3:
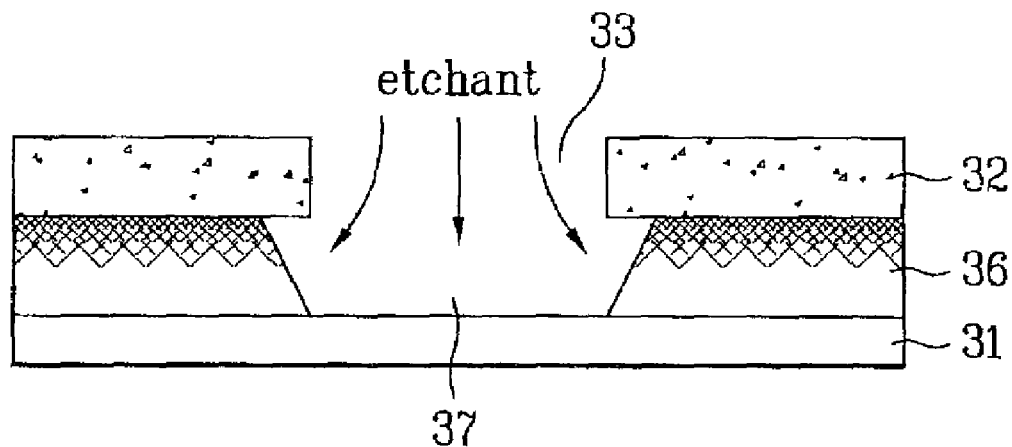
FIG. 3 illustrates a cross-sectional view for a method of forming an insulating layer according to one embodiment of the present invention.

FIG. 3 illustrates a cross-sectional view for a method of forming an insulating layer according to one embodiment of the present invention. When an insulating layer 36, as shown in FIG. 3, is deposited on a glass substrate 31, a gas composition ratio, RF strength, pressure and temperature inside a vacuum chamber, and the distance between upper and lower electrodes are varied to control a density of the insulating layer 36. For example, the gas composition ratio on the glass substrate 31, as shown in FIG. 3, is maintained uniformly but the RF strength, pressure, temperature, and the like are increased gradually to increase the density of the insulating layer 36 gradually as the layer is deposited. Then, a photoresist 32 is coated on the glass substrate 31 having the insulating layer 36 formed thereon, and the photoresist 32 is patterned by exposure and development to form a photoresist hole 33 in the photoresist 32. Subsequently, an insulating layer hole 37 is formed by removing the insulating layer 36 selectively using the patterned photoresist 32 as a mask. The resulting step profile of the insulating layer hole 17 is sharp since the density of the upper portion of the insulating layer 36 is greater than the density of the lower portion.

Figure 4:
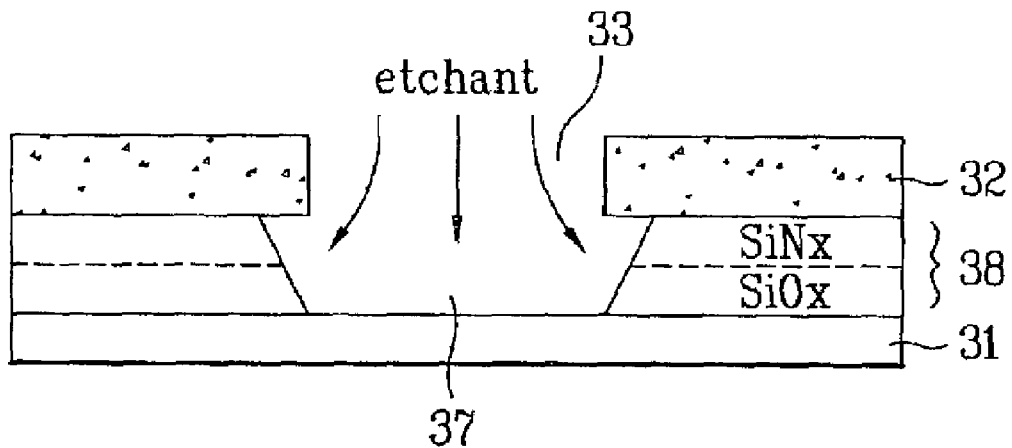
FIG. 4 illustrates a cross-sectional view for a method of forming an insulating layer according to another embodiment of the present invention.

FIG. 4 illustrates a cross-sectional view for a method of forming an insulating layer according to another embodiment of the present invention. The method of forming an insulating layer according to another embodiment of the present invention maintains RF strength, pressure, and temperature but varies a gas composition ratio to deposit lower and upper portions of an insulating layer 38 with $SiO_x$ and $SiON_x$, respectively. Namely, $SiH_4$ and $N_2O$ are initially supplied inside a deposition equipment, and then $NH_3$ is supplied thereto additionally or $NH_3$ is supplied thereto instead of $N_2O$. Thus, a $SiN_x$ or $SiON_x$ is stacked on a $SiO_x$ layer. In the alternative, a $SiON_x$ layer is stacked on a $SiO_x$ layer and then a $SiN_x$ is stacked on the $SiON_x$ layer. Because $SiN_x$ or $SiON_x$ has excellent adhesion to the photoresist 32, under-etching of the photoresist is prevented and thus the step profile of the insulating layer hole 37 is sharp.

FIGS. 5A to 5F illustrate cross-sectional views of forming a polysilicon thin film transistor according to the present invention. In reference to FIG. 5A, amorphous silicon (—Si) is deposited on an entire surface of a glass substrate 41 to form an amorphous silicon layer by plasma CVD. Annealing is carried out using an excimer laser to crystallize the amorphous silicon layer into a polysilicon layer. Subsequently, the polysilicon layer is patterned selectively by photolithography and etch processes to form an island type active layer 43. Here, a buffer oxide layer (not shown) can be additionally formed by depositing $SiO_2$ on an entire surface of the glass substrate 41 before the active layer 43 is formed. The buffer oxide layer prevents impurities or particles of the glass substrate 41 from diffusing into the active layer 43 as well as cutting off heat transfer into the glass substrate 41 during the crystallization process. After the polysilicon layer is patterned, a first insulating layer 44 is formed on an entire surface including the active layer 43 by depositing silicon oxide ($SiO_x$) at 300~400° C. by PECVD, LPCVD, sputtering, or the like using silane ($SiH_4$) gas.

Figure 5A:
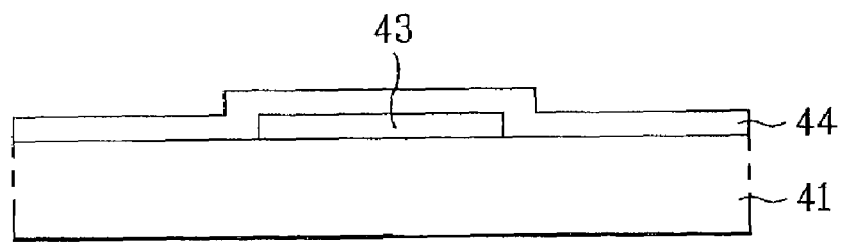
FIGS. 5A to 5F illustrate cross-sectional views of forming a polysilicon thin film transistor according to the present invention.
Figure 5B:
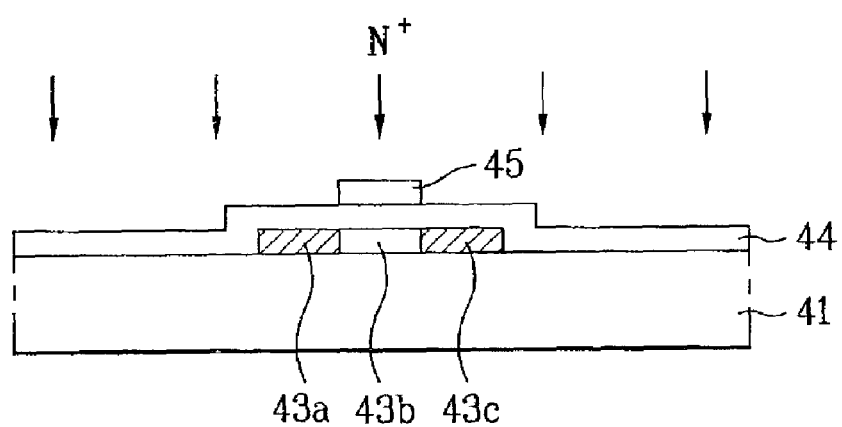

Referring to FIG. 5B, an electrically conductive material such as Al, Al alloy, or the like is deposited on an entire surface of the glass substrate 41 including the first insulating layer 44, and is then patterned selectively by photolithography to form a gate electrode 45 on a predetermined portion over the active layer 43. Subsequently, n-type or p-type impurity ions are implanted in the active layer 43 using the gate electrode 45 as a mask to form source/drain regions 43a and 43c. The remaining portion of the active layer 43 blocked by the gate electrode 45 to have no impurity ions implanted therein becomes a channel region 43b.

Figure 5C:
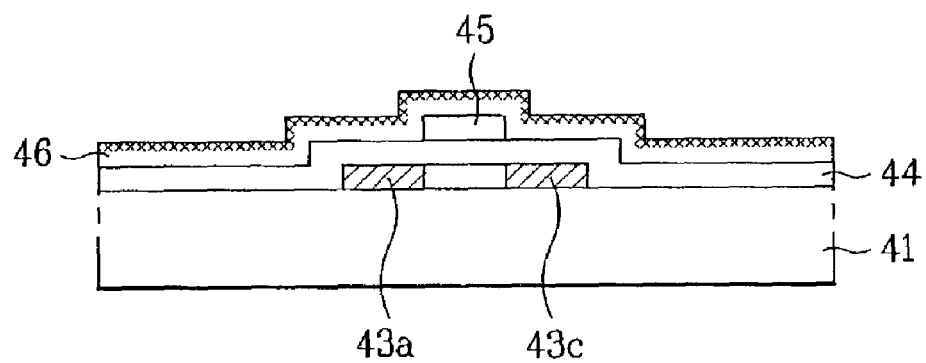

Referring to FIG. 5C, a second insulating layer 46 is formed by depositing an inorganic insulating layer including at least one of $SiO_x$, $SiON_x$, $SiN_x$, or a stacked combination thereof on an entire surface including the gate electrode 45 by PECVD, LPCVD, sputtering, or the like using silane ($SiH_4$) gas. During the deposition of the second insulating layer 46, a gas composition ratio or a radio frequency (RF) power in the deposition equipment is varied such that the density in the upper portion of the second insulating portion is larger than the density of the lower portion of the second insulating layer.

Figure 5D:
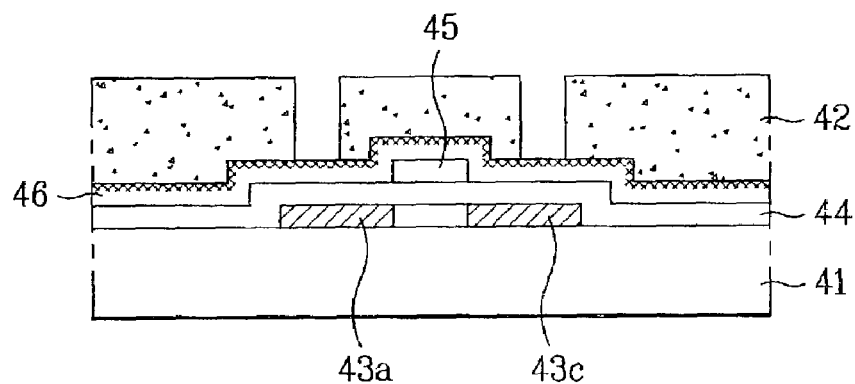

Referring to FIG. 5D, a photoresist 42 is coated on an entire surface including the second insulating layer 46. The photoresist 42 is then patterned by exposure and development to define a contact areas 47.

Figure 5E:
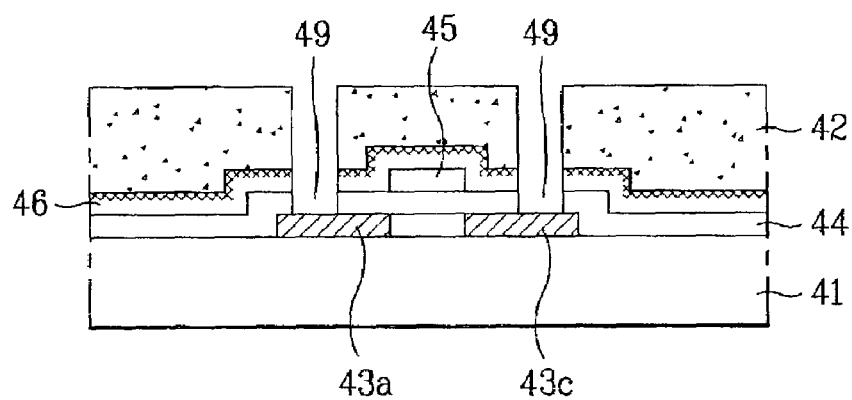

Referring to FIG. 5E, the second and first insulating layers 46 and 44 are selectively removed to form contact holes 49 exposing predetermined surfaces of the source/drain regions 43a and 43c, respectively using the patterned photoresist 42 as a mask.

In this case, when the contact holes 49 are being formed, the first and second insulating layers 44 and 46 are etched together by wet etch. The density of the upper portion of the second insulating layer 46 is greater than the density of the lower portion of the second insulating layer 46 and the first insulating layer 44 to prevent over-etching of the second insulating layer 46. Hence, the step profile of each of the contact holes 47 becomes sharp and maintains a fine pattern, which reduces the size of the TFT. Therefore, the present invention enables step profile control with a wet etch such that an additional dry etch is not required to form a desired contact hole for the TFT.

The wet etch is an etching method that uses a chemical solution to dissolve the insulating layer. The chemical solution is selected from the group consisting of buffered oxide etchant (BOE) or OZ acid{(COOH)$_2$}. BOE is prepared by mixing HNO$_3$, HCL, and deionized (DI) water at a predetermined weight ratio.

Figure 5F:
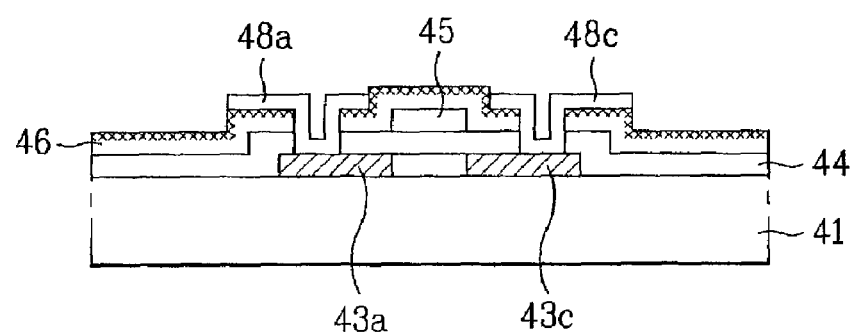

Referring to FIG. 5F, a metal layer is deposited on an entire surface of the second insulating layer 46 and into the contact holes 49, and is then patterned by photolithography to form source and drain electrodes 48a and 48c connected to the source and drain regions 43a and 43c through the contact holes 49, respectively. Thus, the polysilicon thin film transistor using polysilicon of a high mobility as a channel layer is completed by the above-described method.

In the alternative, the first and second insulating layers 44 and 46 can be made of the same material such that the second insulating layer 46 has a higher density than the first insulating layer 44 to overcome the problem of over-etch of the second insulating layer 46 in the related art. Further, a composite having excellent adhesion to the photoresist 42, such as SiN$_x$ or SiON$_x$, can be placed on the second insulating layer 46, or can be used as the second insulating layer 46. Further, if a contact hole 49 having a more rectangular step profile or a sharper step profile is needed, the density of the upper portion of the second insulating layer can be greater than the lower portion of the second insulating layer and the density of the lower portion of the second insulating layer can be greater than the first insulating layer.

Figure 6:
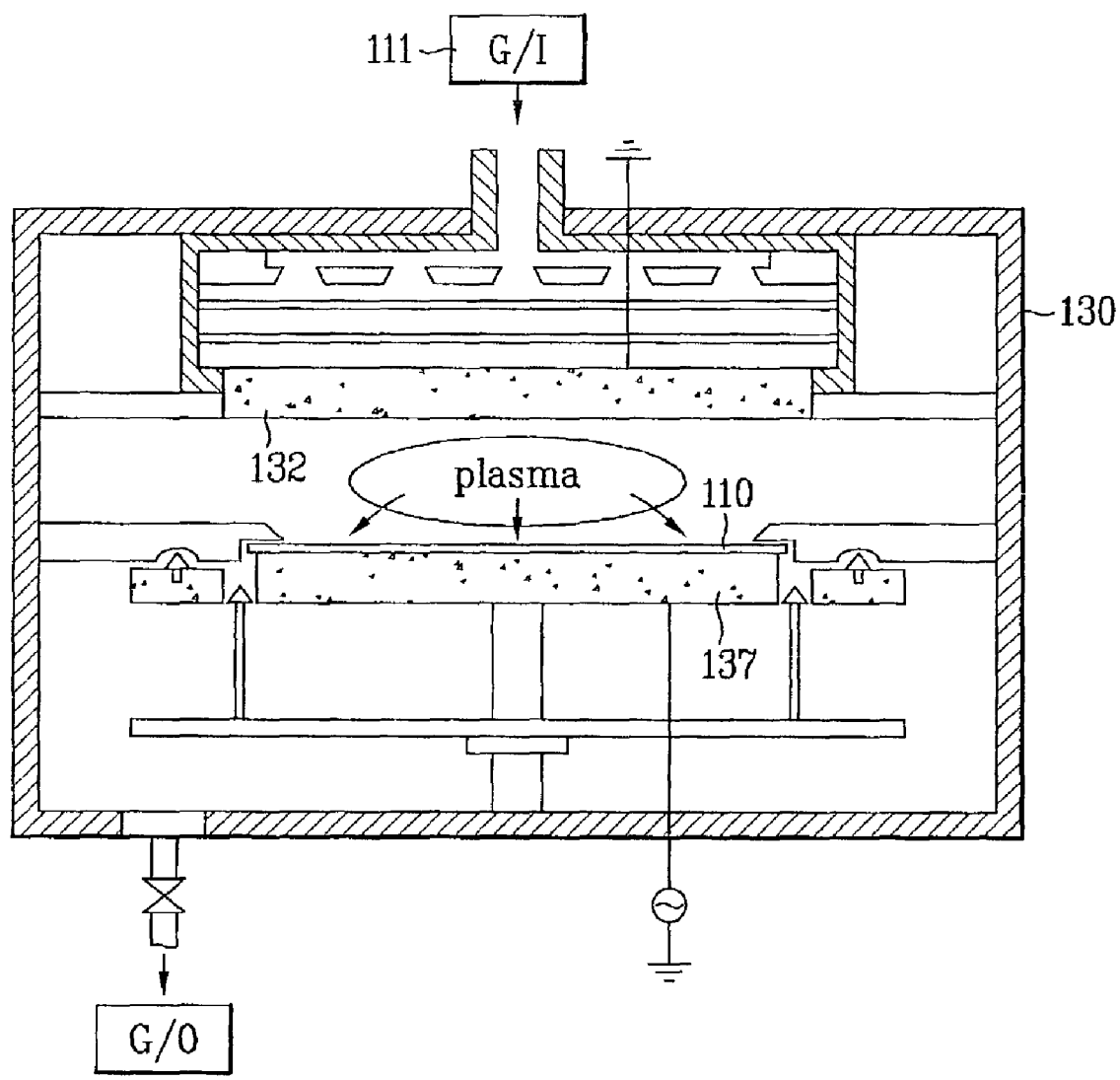
FIG. 6 illustrates a structural diagram of plasma equipment.

A method of forming an insulating layer by PECVD is explained in reference to FIG. 6. A glass substrate 110 is loaded on a lower electrode 137 in a vacuum chamber 130 and a gas is supplied inside the vacuum chamber 130 through a gas supply unit (G/I) 111, as shown in FIG. 6. Subsequently, an upper electrode 132 as an anode electrode is grounded and an AC electric field (generally RF) varying periodically is applied to the lower electrode 137 as a cathode electrode. Then, the gas is turned into plasma. The 'G/O' in FIG. 6 is a gas discharging unit. The material in the plasma is accelerated by the electric field to move toward the lower electrode 137, thereby depositing the material from the gas on an upper surface of the glass substrate 110.

The gas supplied through the gas supply unit 111 depends on a material to be deposited. For example, if SiO$_x$ is to be deposited, SiH$_4$:N$_2$O having a ratio of 0.15:1.8 is supplied. Further, if SiN$_x$ is to be deposited, SiH$_4$:NH$_3$ having a ratio of 0.1:2.25 is supplied. Furthermore, if SiON$_x$ is to be deposited, SiH$_4$, N$_2$O, and NH$_3$ are supplied with a proper ratio.

The deposited SiO$_x$, SiON$_x$, SiN$_x$ or a stacked combination thereof becomes a second insulating layer 46, such as shown in FIG. 5F. The density of the second insulating layer 46 can be controlled by varying a depositing process condition. Hence, the present invention can control the density by varying at least one of gas composition ratio, RF strength, pressure and temperature inside the vacuum chamber, a distance between the upper and lower electrodes, and the like. For example, the gas composition ratio is maintained constant but the RF strength, pressure, temperature, and the like are increased gradually, whereby the density of the second insulating layer 46 increases gradually as it is deposited. When the density of an upper portion of the second insulating layer 46 is larger than that of a lower portion of the second insulating layer 46, an etch rate of the upper portion of the second insulating layer 46 is slower than that of the lower portion of the second insulating layer 46 when an etchant penetrates. Hence, a step profile of the contact hole becomes sharp.

In another example, the RF strength, pressure, and temperature are maintained constant but the gas composition ratio is varied, whereby SiO$_x$ is deposited as the lower portion of the second insulating layer 46, and SiN$_x$ or SiNO$_x$ is deposited as the upper portion of the second insulating layer 46. This is achieved by SiH$_4$ and N$_2$O being initially supplied inside the vacuum chamber, and then NH$_3$ being additionally supplied or NH$_3$ being supplied instead of N$_2$O. SiN$_x$ and SiON$_x$ have excellent adhesion to the photoresist 42, as shown in FIG. 5D to mitigate the etch rate of the upper portion of the insulating layer 46, thereby enabling the formation of a contact hole with a sharp step profile. In another alternative, SiH$_4$, N$_2$O and NH$_3$ are initially supplied inside the vacuum chamber, and then just SiH$_4$ and NH$_3$ are supplied. Thus, it becomes possible to control a critical dimension uniformly in the LCD device such that aperture or resolution is increased.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming an insulating layer, comprising the steps of:
   preparing a substrate; and
   depositing an insulating layer on the substrate such that density of a top surface of the insulating layer is larger than density of a bottom surface of the insulating layer, wherein density of the insulating layer gradually changes from the bottom surface of the insulating layer to the top surface of the insulating layer.

2. The method of claim 1, wherein depositing an insulating layer includes using deposition equipment that uses plasma.

3. The method of claim 1, wherein depositing an insulating layer includes controlling density of the insulating layer by varying temperature, pressure, RF strength, or gas composition ratio while the insulating layer is being deposited.

4. The method of claim 1, wherein the insulating layer is formed of at least one of SiO$_x$, SiON$_x$, and SiN$_x$.

5. The method of claim 1, wherein depositing an insulating layer includes stacking SiN$_x$ on SiO$_x$.

6. The method of claim 5, wherein depositing an insulating layer includes initially supplying $SiH_4$ and $N_2O$ to a deposition equipment and then supplying $NH_3$ to the deposition equipment instead of $N_2O$.

7. The method of claim 1, wherein depositing an insulating layer includes stacking $SiON_x$ on $SiO_x$.

8. The method of claim 7, wherein depositing an insulating layer includes initially supplying $SiH_4$ and $N_2O$ to a deposition equipment and then additionally supplying $NH_3$ to the deposition equipment.

9. A method of fabricating a thin film transistor, comprising the steps of:

forming an active layer on a substrate;

forming a first insulating layer on the active layer;

forming a gate electrode on the first insulating layer to be isolated from the active layer;

forming source/drain regions by implanting ions in portions of the active layer at both sides of the gate electrode, respectively;

forming a second insulating layer on the first insulating layer such that density of the second insulating layer gradually changes from a bottom surface of the second insulating layer to a top surface of the second insulating layer, wherein density of the top surface of the second insulating layer is larger than density of the bottom surface of the second insulating layer;

forming contact holes in the first and second insulating layers that expose the source/drain regions, respectively; and forming source/drain electrodes connected to the source/drain regions through the contact holes, respectively.

10. The method of claim 9, wherein the density of an upper portion of the second insulating layer is larger than that of a lower portion of the second insulating layer.

11. The method of claim 10, wherein the second insulating layer is formed of $SiO_2$.

12. The method of claim 9, wherein the active layer is formed of polysilicon.

13. The method of claim 9, wherein forming contact holes includes removing portions of the first and second insulating layers with only a wet etching method.

14. The method of claim 9, wherein the first insulating layer is formed of a different material than the second insulating layer.

15. The method of claim 9, wherein the second insulating layer is $SiO_x$, $SiN_x$, $SiON_x$ or a stacked combination thereof.

16. The method of claim 9, wherein forming a second insulating layer includes deposition with deposition equipment that uses plasma.

17. The method of claim 16, wherein forming the second insulating layer includes controlling the density of the second insulating layer by varying temperature, pressure, RE strength, or gas composition ratio while the second insulating layer is being deposited.

18. The method of claim 10, wherein the density of the lower portion of the second insulating layer is larger than the density of the first insulating layer.

19. The method of claim 18, wherein the first insulating layer is formed of a different material than the upper portion of the second insulating layer.

20. The method of claim 9, wherein forming an active layer includes:

forming an amorphous silicon layer on the substrate;

crystallizing the amorphous silicon layer into a polysilicon layer by annealing; and removing the polysilicon layer selectively by photolithography and etch process.

21. The method of claim 20, wherein forming the active layer further includes forming a buffer oxide layer between the substrate and amorphous silicon layer.

* * * * *